United States Patent
Matsushima

(10) Patent No.: US 7,953,145 B2
(45) Date of Patent: *May 31, 2011

(54) PULSE WIDTH MODULATION SIGNAL GENERATING CIRCUIT

(75) Inventor: Makoto Matsushima, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 459 days.

This patent is subject to a terminal disclaimer.

(21) Appl. No.: 12/061,360

(22) Filed: Apr. 2, 2008

(65) Prior Publication Data

US 2008/0203933 A1 Aug. 28, 2008

Related U.S. Application Data

(63) Continuation of application No. 10/695,839, filed on Oct. 29, 2003, now Pat. No. 7,372,902.

(30) Foreign Application Priority Data

Nov. 21, 2002 (JP) .................................. 2002-338129

(51) Int. Cl.
*H03K 7/08* (2006.01)
*H03K 9/08* (2006.01)

(52) U.S. Cl. ...................... 375/238; 332/109; 327/175

(58) Field of Classification Search .................. 375/238; 332/109; 327/175

See application file for complete search history.

(56) References Cited

U.S. PATENT DOCUMENTS

| | | | | |
|---|---|---|---|---|
| 4,951,159 | A * | 8/1990 | Van Beek | 358/3.01 |
| 5,453,788 | A | 9/1995 | Matsushima et al. | |
| 5,598,160 | A | 1/1997 | Matsushima | |
| 6,201,414 | B1 * | 3/2001 | Yazdy | 326/93 |
| 6,636,124 | B1 * | 10/2003 | Liu | 332/109 |
| 6,639,368 | B2 | 10/2003 | Sheoghong | |
| 6,658,583 | B1 * | 12/2003 | Kudo et al. | 713/500 |
| 6,828,836 | B1 | 12/2004 | Barrow et al. | |
| 7,372,902 | B2 * | 5/2008 | Matsushima | 375/238 |

FOREIGN PATENT DOCUMENTS

| | | |
|---|---|---|
| JP | 6-127025 | 5/1994 |
| JP | 2003-264316 | 9/2003 |

* cited by examiner

*Primary Examiner* — Phuong Phu
(74) *Attorney, Agent, or Firm* — Cooper & Dunham LLP

(57) ABSTRACT

A PWM signal generating circuit outputs a stable PWM signal for increasing and decreasing a duty ratio at a predetermined rate within a predetermined period without requiring an improvement of a process capacity of a CPU as compared to a conventional PWM signal generating circuit. The PWM signal generating circuit consists of a plurality of circuit elements each of which outputs a digital signal. A first counter circuit periodically changes a PWM signal output therefrom into an active state. A second counter circuit changes the PWM signal, which has been changed into the active state by the first counter circuit, into an inactive state within each cycle. The second counter circuit increases and decreases an active-to-inactive time period from a time when the PWM signal is changed into the active state to a time when the PWM signal is changed into the inactive state.

10 Claims, 8 Drawing Sheets

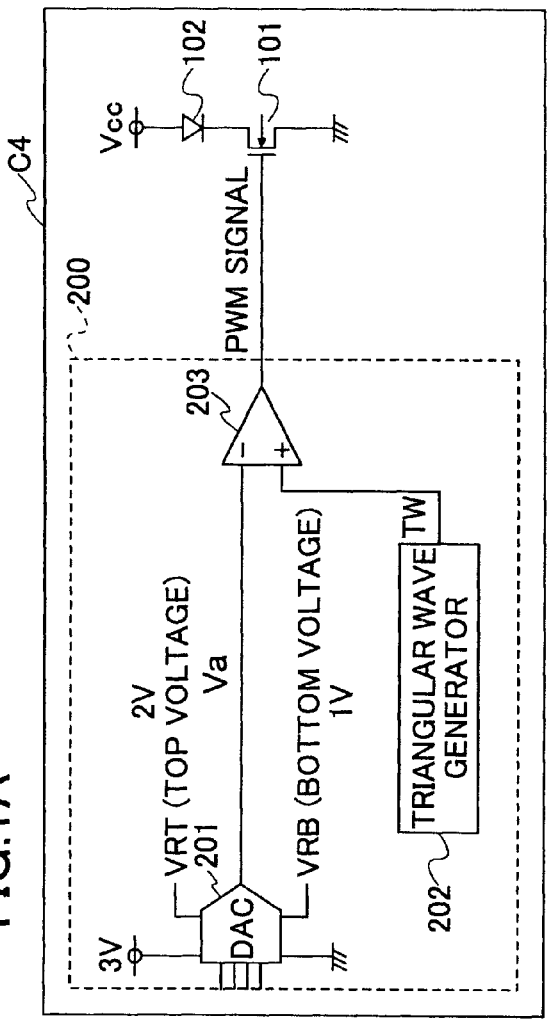
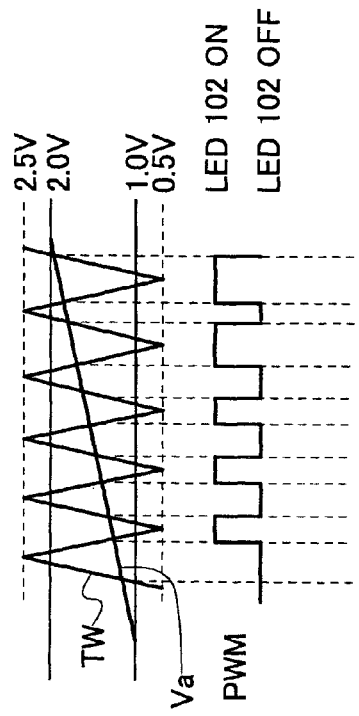
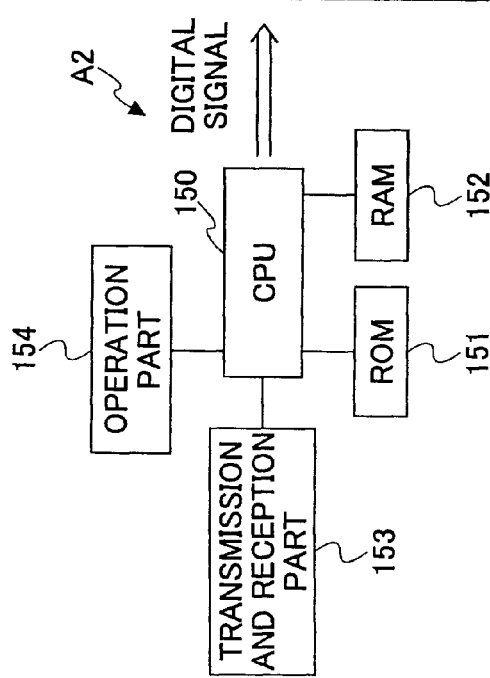
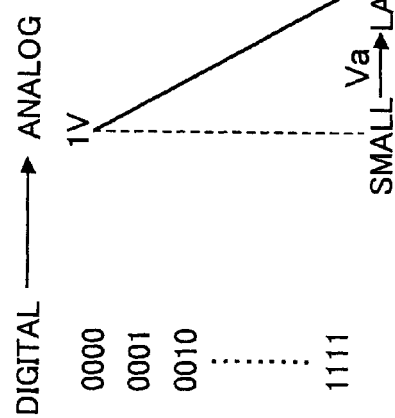
FIG.1A
FIG.1B
FIG.1C

PULSE WIDTH MODULATION SIGNAL GENERATING CIRCUIT

CROSS-REFERENCE TO RELATED APPLICATION

The subject application is a Rule 1.53(b) continuation of Ser. No. 10/695,839, filed Oct. 29, 2003 now U.S. Pat. No. 7,372,902, the entire contents of which are incorporated herein by reference.

BACKGROUND

1. Technical Field

This disclosure generally relates to pulse width modulation signal generating circuits and, more particularly, to a pulse width modulation signal generating circuit which generates a pulse width modulation signal supplied to a light-emitting device such as a light-emitting diode to cause the light-emitting device to emit a light.

2. Description of the Related Art

FIG. 1A is a block diagram showing a structure of a portable telephone A2 provided with a luminescence circuit C4 of a light-emitting diode 102, which uses a conventional pulse width modulation (PWM) signal generating circuit 200. The portable telephone A2 comprises, in addition to the luminescent circuit C4, a central processing unit (CPU) 150, a read only memory (ROM) 151 which stores a control program of the luminescent circuit C4, a random access memory (RAM) 152 which is used as a work memory when executing each program, a transmission and reception part 153 and an operation part 154 including a liquid crystal panel, a ten-key, a microphone and a speaker.

The CPU 150 controls the light-emitting diode 102, which is an incoming call lamp, provided in the luminescence circuit C4 to emit a wavy light at a time of reception of a telephone call signal from a remote terminal. Here, the emission of a wavy light refers to a light-emitting method in which an intensity of light is increased and decreased gradually in a wavelike manner.

Specifically, the CPU 150 outputs a 4-bit digital signal increasing and decreasing with a predetermined cycle to the luminescence circuit C4. A PWM signal generating circuit 200, which constitutes the luminescence circuit C4, applies a PWM signal determined according to a value of the digital signal output from the CPU 150 to a gate of an N-channel type MOSFET 101. When the PWM signal supplied is active, i.e., at a high level in the luminescence circuit C4, the MOSFET 101 turns on so as to cause the light-emitting diode 102, to which a power supply voltage Vcc is supplied, to emit a light.

A digital-to-analog converter (DAC) 201 provided in the PWM signal generating circuit 200 is driven by a voltage of 3V, a voltage of 2V being input as a top voltage VRT and a voltage of 1V being input as a bottom voltage VRB. The DAC 201 outputs an analog signal Va (1V-2V) corresponding to the value (0000-1111) of the 4-bit digital signal supplied from the CPU 150 of the portable telephone, as shown in FIG. 1B. A triangular-wave generator 202 outputs a triangular wave TW of a predetermined frequency. As shown in FIG. 1C, a comparator 203 outputs the PWM signal of a high level or a low level according to the sign (positive or negative) of the difference that is obtained by subtracting the analog signal Va output from the DAC 201 from the triangular-wave signal TW output from the triangular-wave generator 202.

It should be noted that the luminescence circuit C4 mentioned above does not relate to an invention which has become publicly known.

In the luminescence circuit C4 having the above-mentioned structure, in order to cause the light-emitting diode 102 to emit a wavy light, that is, in order to gradually turn on and turn off the light-emitting diode 102 within a period T, the CPU 150 is required to execute a control program to gradually increase the value of the 4-bit digital signal within one half (2/T) of the period T and then gradually decrease the digital signal within another half (2/T) of the period T. In this case, the CPU 150 is required to execute the above-mentioned control program parallel to other processes such as an incoming call reception processes (a display control of a liquid crystal panel constituting the operation part 154), thereby increasing a load to the CPU 150. For this reason, in order to achieve a smooth incoming call reception process, a CPU is required which can operate at a higher speed but more expensive than a CPU of a portable telephone provided with a luminescence circuit which does not cause a light-emitting diode to emit the above mentioned wavy light.

In the PWM signal generating circuit 200 used in the above-mentioned luminescence circuit C4, even when there is no arrival of an incoming call and there is no need to cause the light-emitting diode 102 to emit a light, an electric power of the voltage of 3V is consumed unless a power supply is turned due to an energy saving function, etc. Moreover, since there is a part which processes an analog signal in the circuit, a fluctuation tends to be generated in the output PWM signal.

BRIEF SUMMARY

In an aspect of this disclosure, there is provided a PWM signal generating circuit which outputs a stable PWM signal for increasing and decreasing a duty ratio at a predetermined rate within a predetermined period without requiring an improvement of a process capacity of a CPU as compared to a conventional PWM signal generating circuit.

In another aspect, there is provided a PWM signal generating circuit comprising: a first counter circuit periodically changing a PWM signal output therefrom into an active state; and a second counter circuit changing the PWM signal, which has been changed into the active state by the first counter circuit, into an inactive state within each cycle, wherein the second counter circuit increases and decreases an active-to-inactive time period from a time when the PWM signal is changed into the active state to a time when the PWM signal is changed into the inactive state.

The aforementioned PWM signal generating circuit may consist of a plurality of circuit elements each of which outputs a digital signal.

The aforementioned PWM signal generating circuit may further comprise a first specifying circuit that specifies an upper limit value and a lower limit value, wherein the second counter circuit may change the active-to-inactive time period periodically within a range between the upper limit value and the lower limit value.

Additionally, the aforementioned PWM signal generating circuit may further comprise a second specifying circuit that specifies a first schedule time and a second schedule time, wherein the second counter circuit may start to decrease the active-to-inactive time period after the active-to-inactive time period reaches the upper limit value and the first schedule time has elapsed, and the second counter circuit may increase the active-to-inactive time period after the active-to-inactive time period reaches the lower limit value and the second schedule time has elapsed.

The aforementioned PWM signal generating circuit can smoothly increase and decrease a duty ratio of the PWM signal only by being supplied with a reference clock signal after the operation parameters are set. Thereby, the load to a CPU which controls the PWM signal generating circuit is reduced. Moreover, if the PWM signal generating circuit is constituted by only circuit elements each of which outputs a digital signal, a more stable operation can be achieved than a case where a luminescence time is adjusted using circuit elements outputting analog signals such as an analog-to-digital converter (DAC).

Moreover, since an electric power is consumed by operation only at a reception time, a power consumption is much less than that in a case where a DAC is used which consumes an electric power at a time other than a reception time, unless a power is turned off due to an energy saving function, etc., thereby suitable for an application such as a portable telephone which is driven by a battery.

The aforementioned and other aspects, features and advantages will become more apparent from the following detailed description when read in conjunction with the accompanying drawings.

BRIEF DESCRIPTION OF THE DRAWINGS

FIG. 1A is a block diagram of a portable telephone provided with a luminescence circuit of a light-emitting diode, which uses a conventional pulse width modulation signal generating circuit;

FIG. 1B is an illustration for explaining a digital-to-analog conversion performed by a digital-to-analog converter shown in FIG. 1A;

FIG. 1C is an illustration for explaining a generation of a PWM signal generated by a comparator shown in FIG. 1A;

DETAILED DESCRIPTION OF THE PREFERRED EMBODIMENTS

Figure 2:
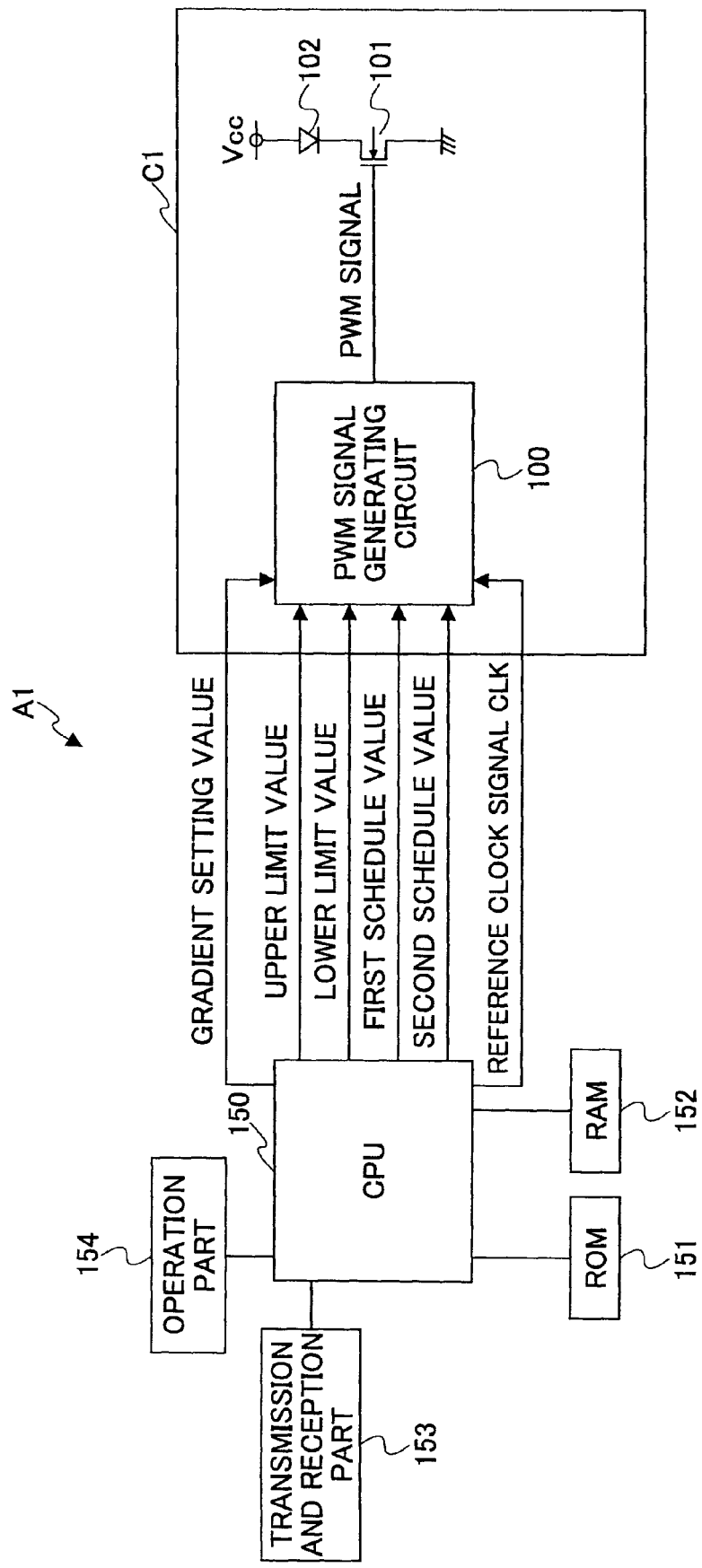
FIG. 2 is a block diagram of a portable telephone provided with a luminescence circuit using a PWM signal generating circuit according to an embodiment of the present invention.

A description will now be given, with reference to the drawings, of an embodiment of the present invention. FIG. 2 is a block diagram of a portable telephone A1 provided with a luminescence circuit C1 using a PWM signal generating circuit 100 according to an embodiment of the present invention.

The portable telephone A1 comprises, in addition to the above-mentioned luminescence circuit C1, a central processing unit (CPU) 150, a read only memory (ROM) 151 which stores programs executed when an incoming call is detected, a random access memory (RAM) 152 which is used as a work memory when executing each program, a transmission and reception part 153 and an operation part 154 including a liquid crystal panel, a ten-key, a microphone and a speaker. It should be noted that the same reference numerals are given to parts equivalent to the parts of the portable telephone A2 shown in FIG. 1A.

The luminescence circuit C1 controls an intensity of a light emitted from the light-emitting diode 102 to increase and decrease at a predetermined cycle only by specifying necessary operation parameters (a gradient setting value, an upper limit value, a lower limit value, a first target value and a second target value), without a digital signal, which increases and decreases at the predetermined cycle, being output from the CPU 150. The designation of the above-mentioned operation parameters is not limited to a method in which the operation parameters are set by an external source such as the CPU 150, and the operation parameters may be set to their target values in the luminescence circuit C1.

Specifically, the CPU 150 outputs, as operation parameters, information regarding a gradient setting value, upper and lower limit values and first and second schedule values. The gradient setting value (8-bit data) is for setting a degree of a smooth turn-on and turn-off of the light-emitting diode 102. The upper and lower limits are for the luminescence duty ratio of the light-emitting diode 102. The first and second schedule values are for setting time periods (first and second schedule time) after the luminescence duty ratio of the light-emitting diode 102 becomes the maximum or minimum value until the luminescence duty ratio is started to be decreased or increase, respectively. The CPU 150 also outputs a reference clock signal CLK. The reference clock signal CLK may be generated by an external circuit other than the luminescence circuit C1 or the CPU 150.

The luminescence circuit C1 comprises: a PWM signal generating circuit 100 according to the embodiment of the present invention; an N-channel type MOSFET 101 having a gate which receives the PWM signal output from the PWM signal generating circuit 100; and a light-emitting diode 102 connected between a drain electrode of the FET 101 and a power supply voltage Vcc. When the PWM signal output from the PWM signal generating signal in the luminescence circuit C1 is active, that is, at a high level, the FET 101 turns on and the light-emitting diode 102 emits a light. On the other hand, when the PWM signal is the inactive, that is, at a low level, the FET 101 turns off, thereby turning off the light-emitting diode 102.

The PWM signal generating circuit 100 increases the luminescence duty ratio of the light-emitting diode 102 to an upper limit value at a speed (tempo or rhythm) corresponding to the value of the gradient setting value. When the luminescence duty ratio of the light-emitting diode 102 reaches the upper limit value, the luminescence duty ratio is maintained at the upper limit valued for a time period (the first schedule time) until a counter 4f mentioned later counts up the first schedule value. Thereafter, the luminescence duty ratio is decreased at a speed determined by the above-mentioned gradient setting value until the luminescence duty ratio of the light-emitting diode 102 reaches the lower limit value. When the luminescence duty ratio of the light-emitting diode 102 reaches the lower limit value, the luminescence duty ratio is maintained at the lower limit valued for a time period (the second schedule time) until a counter 4i mentioned later counts up the second schedule value. Thereafter, the PWM signal generating circuit 100 again increases the luminescence duty ratio of the light-emitting diode 102 to the upper limit value at a speed (tempo or rhythm) corresponding to the value of the gradient setting value so as to continue the above-mentioned control of the luminescence duty ratio of the light-emitting diode 102.

Figure 3:
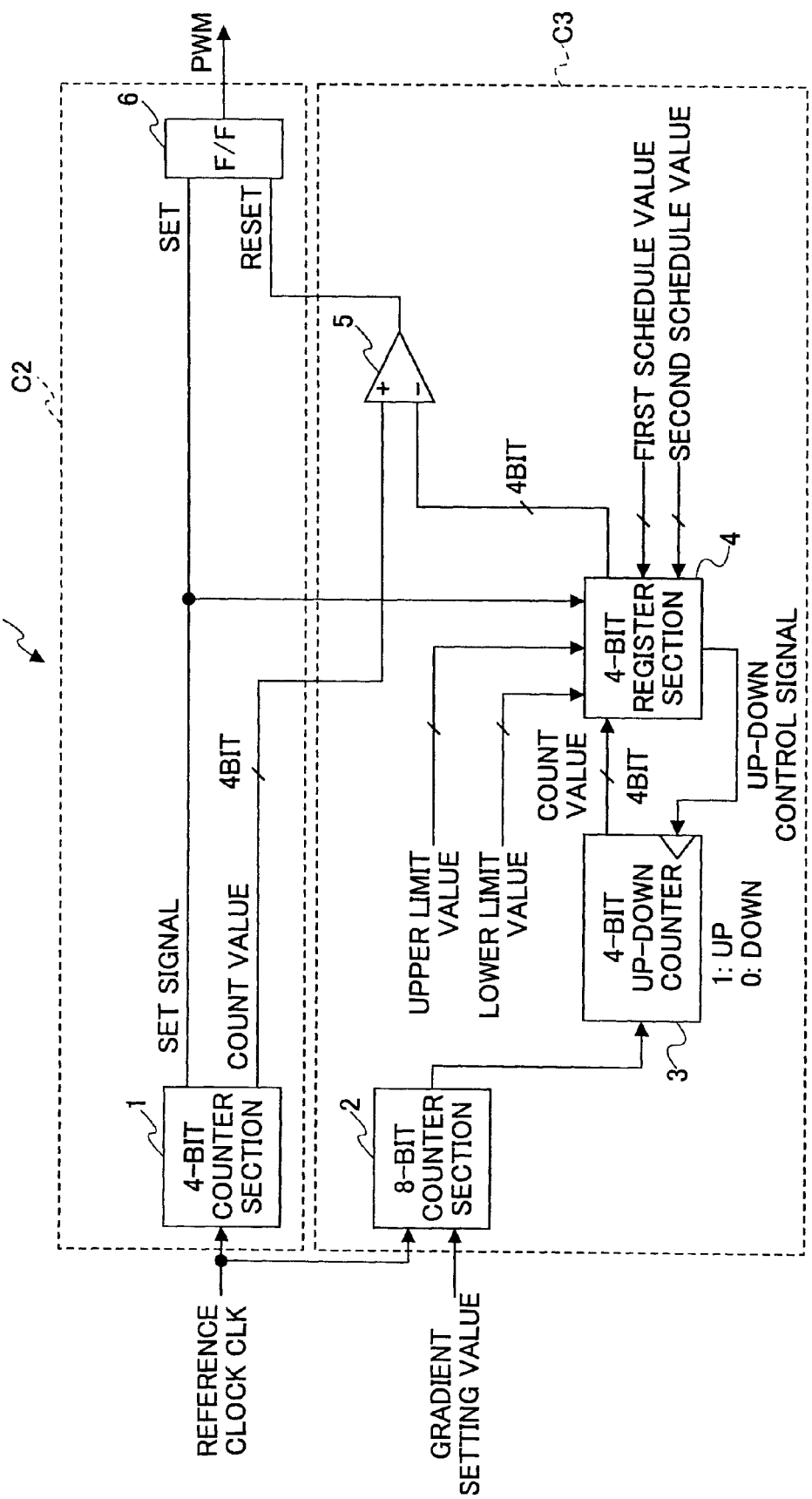
FIG. 3 is a block diagram of a structure of the PWM signal generating circuit.

FIG. 3 is a block diagram showing a structure of the PWM signal generating circuit 100. The PWM signal generating circuit is constituted by only circuit elements outputting digital signals, and comprises a first counter circuit C2 and a second counter circuit C3. The first counter circuit C2 changes the output PWM signal to be active periodically. The second counter circuit C3 changes the PWM signal to be inactive within each period, and increases and decreases a time period from a time when the PWM signal is changed to be active (at a high level in this circuit) until a time when the PWM signal is changed to be inactive (at a low level in) this circuit).

A 4-bit counter section 1 operates in synchronization with a reference clock signal CLK so as to output a high-level pulsed set signal (1-bit data) when starting a count and also output a count value (4-bit data) at an appropriate time. An 8-bit counter section 2 operates based on the reference clock signal CLK so as to output a high-level pulsed trigger signal (1-bit data) when the count value (8-bit data) matches a gradient setting value (8-bit data) supplied by the CPU 150 and also reset the count value. A 4-bit up-down counter 3 performs a counting operation according to the input of the high-level pulsed trigger signal (1-bit data) output from the 8-bit counter section 2. The 4-bit up-down counter 3 functions as an up-counter when an up-down control signal is at a high level, and also functions as a down-counter when the up-down control signal is at a low level.

The 4-bit register section 4 holds the count value (4-bit data) which the 4-bit up-down counter 3 outputs at the time of input of the set signal from the 4-bit counter section 1, and outputs the count value to a comparator 5 of the subsequent stage. When the count value (4-bit data) of the counter 3 concerned becomes equal to a predetermined maximum value (4-bit data) while the counter 3 is functioning as an up-counter, the 4-bit register section 4 does not update the value currently held even if it receives the set signal, and, thereafter, outputs the count value which corresponds to the maximum value for a period of time (first schedule period) during which a first built-in counter (corresponding to a counter 4f shown in FIG. 5), which starts at a time when the above-mentioned count value becomes equal to the maximum value, counts a first schedule value. Moreover, when the count value (4-bit data) of the first built-in counter turns into the first schedule value (4-bit data), the 4-bit register section 4 changes the up-down control signal being output to the 4-bit up-down counter 3 to a low level, and updates the held count value to the count value being output by the counter 3 in response to the input of the set signal.

On the other hand, when the count value (4-bit data) of the counter 3 concerned becomes equal to a predetermined minimum value (4-bit data) while the counter 3 is functioning as a down-counter, the 4-bit register section 4 does not update the value currently held even if it receives the set signal, and, thereafter, outputs the count value which corresponds to the minimum value for a period of time (second schedule period) during which a second built-in-counter (corresponding to a counter 4i shown in FIG. 5), which starts at a time when the above-mentioned count value becomes equal to the minimum value, counts a second schedule value. Moreover, when the count value (4-bit data) of the second built-in counter turns into the second schedule value (4-bit data), the 4-bit register section 4 changes the up-down control signal being output to the 4-bit up-down counter 3 to a high level, and updates the held count value to the count value being output by the counter 3 in response to the input of the set signal.

The comparator 5 outputs a reset signal of a high level to a flip-flop 6 when the count value output from the 4-bit counter section 1 becomes larger than the count value output from the 4-bit register section 4.

The flip-flop 6 starts output of the PWM signal, which is a diode luminescence signal, in response to the input of the high-level set signal from the 4-bit counter section 1, and returns the PWM signal to a low level in response to the high-level reset signal from the comparator 5 so as to ends the luminescence.

Figure 4:
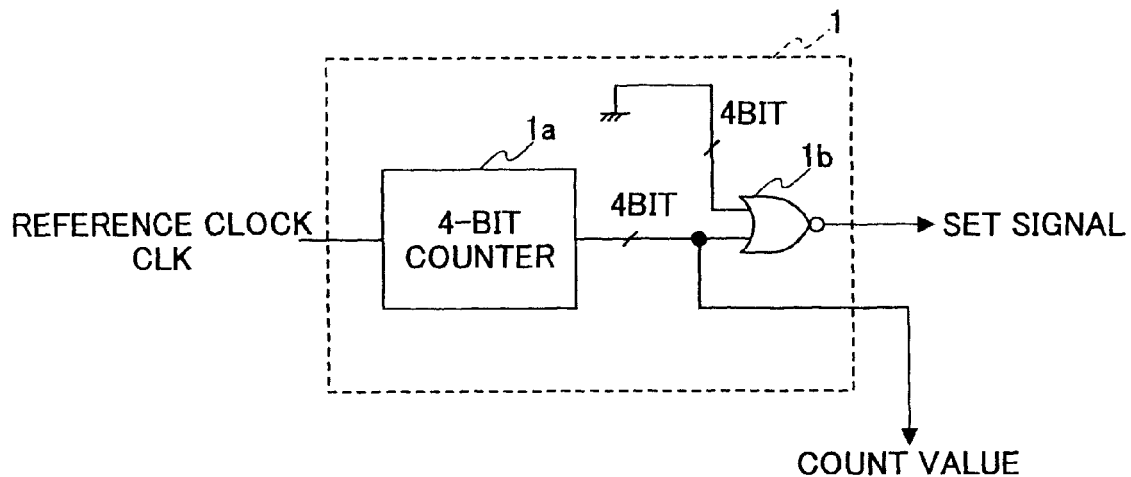
FIG. 4 is a circuit diagram of a 4-bit counter section shown in FIG. 3.

FIG. 4 is a circuit diagram of the 4-bit counter section 1 shown in FIG. 3. The reference clock signal CLK is supplied to a 4-bit counter 1a. An output terminal (a bus which outputs 4-bit data) of the 4-bit counter 1a is connected to one of signal input terminals of a 2-input NOR gate 1b, and also connected to a signal input terminal of the 4-bit register section 4. The remaining signal input terminal of the NOR gate 1b is grounded, and is always supplied with a low level 4-bit signal "0000".

It should be noted that the NOR gate 1b acquires the negative OR of two sets of 4-bit data, and outputs a high-level set signal (1-bit data) only when both the two sets of 4-bit data supplied are "0000". That is, more specifically, the 2-input NOR gate 1b comprises: a 2-input NOR gate having two signal input terminals, data of a least significant bit from among 4-bit date output by the 4-bit counter 1a being supplied to one of the signal input terminals and "0" data being supplied to the remaining signal input terminal; a 2-input NOR gate having two signal input terminals, data of a second least significant bit being supplied to one of the signal input terminals and "0" data being supplied to the remaining signal input terminal; a 2-input NOR gate having two signal input terminals, data of a third least significant bit being supplied to one of the signal input terminals and "0" data being supplied to the remaining signal input terminal; a 2-input NOR gate having two signal input terminals, data of a most significant bit being supplied to one of the signal input terminals and "0" data being supplied to the remaining signal input terminal; and a 4-input AND gate to which output of those four NOR gates are supplied.

Similarly, in the circuit explained below, the logical gates having input terminals, to which a bus line is connected, comprise identical logical gates of a number the same as the number of bits of data flowing through the bus and an AND gate performing all ANDs of the outputs of those logical gates. The logical gates are supplied with sets of data corresponding to the respective bits (which means sets of data of least significant bits, sets of data of second least significant bits, ... ). It should be noted the logical gates explained below are an AND gate 2b shown in FIG. 5 and AND gates 4j and 4g shown in FIG. 6.

Figure 5:
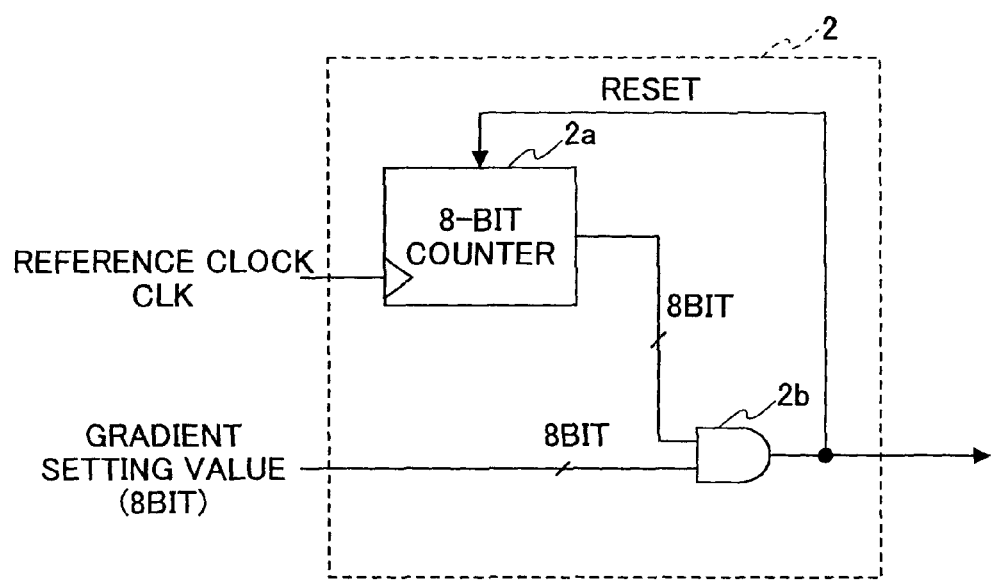
FIG. 5 is a circuit diagram of an 8-bit counter section shown in FIG. 3.

FIG. 5 is a circuit diagram of the 8-bit counter section 2 shown in FIG. 3. The reference clock signal CLK is supplied to an 8-bit counter 2a. An output of the 8-bit counter 2a is connected to the signal input terminal of the 2-input AND gate 2b. A gradient setting value which is 8-bit data is supplied to the remaining signal input terminal of the AND gate 2b. The AND gate 2b outputs a high-level-reset signal (1-bit data) when the sets of the 8-bit data supplied thereto completely match each other. As mentioned above, the AND gate 2b comprises eight AND gates to which sets of data of each corresponding bit is supplied and an 8-input and 1-output AND gate to which outputs of the eight AND gates are supplied.

The output terminal of the AND gate 2b is connected to a clock signal input terminal of the 4-bit up-and-down counter 3, and also connected to a reset signal input terminal of the 8-bit counter 2a. When the count value output from the counter 2a matches the gradient setting value, the output of the AND gate 2b is changed into a high level. Accordingly, the 8-bit counter 2a is reset, and the output signal of the AND gate 2b returns to a low level.

Figure 6:
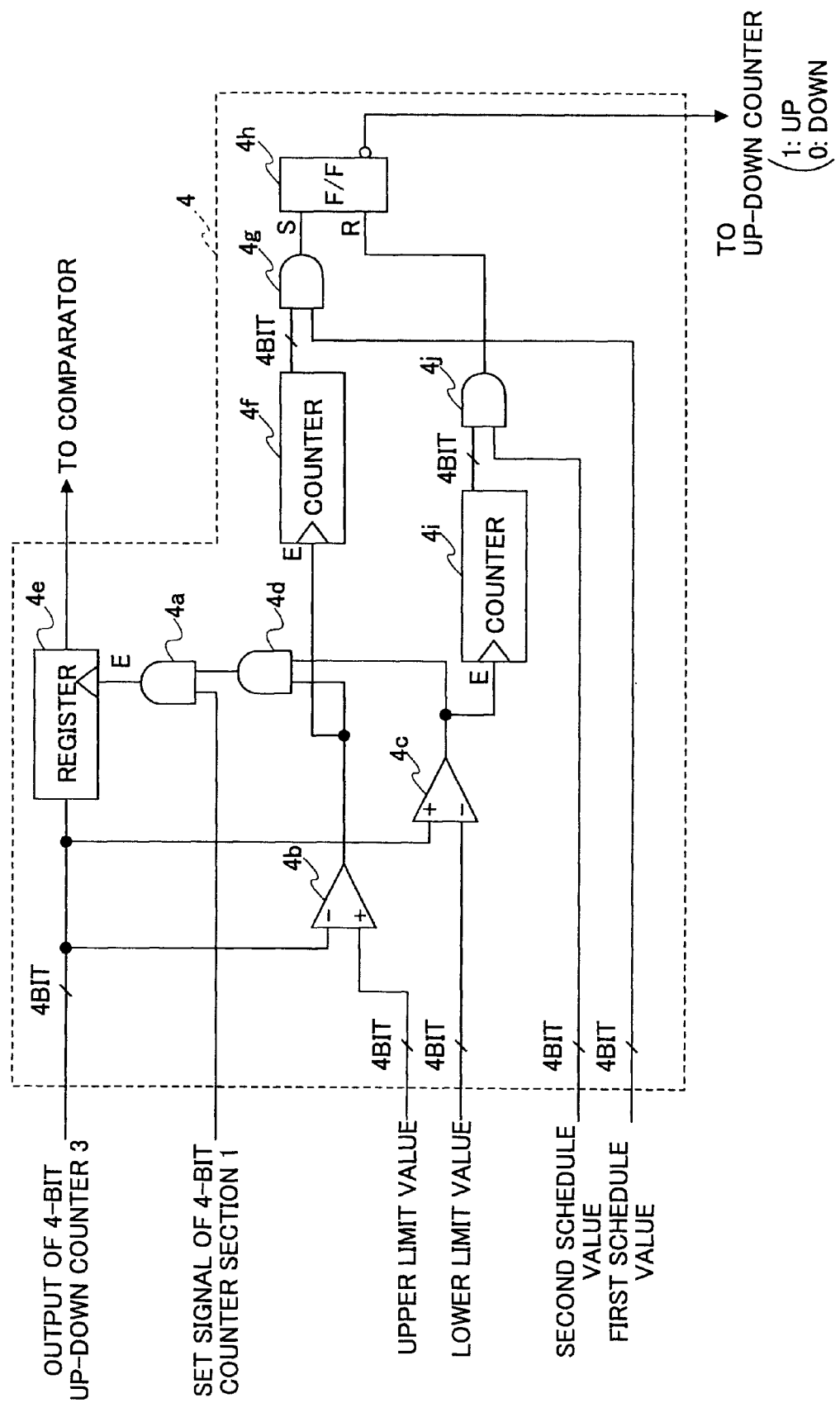
FIG. 6 is a circuit diagram of a 4-bit register section shown in FIG. 3.

FIG. 6 is a circuit diagram of the 4-bit register section 4 shown in FIG. 3. An output signal (4-bit data) of a 4-bit up-down counter 3 is supplied to a negative signal input terminal of a comparator 4b, a positive signal input terminal of a comparator 4c and a data input terminal of a register 4e. The 4-bit data representing an upper limit value is supplied to a positive signal input terminal of the comparator 4b. The comparator 4b outputs a high-level comparison result signal (1-bit data) while the output of the 4-bit up-down counter 3 is equal to or smaller than the upper limit value. On the other hand, the 4-bit data representing an lower limit value is supplied to a negative signal input terminal of the comparator 4c. The comparator 4c outputs a high-level comparison result signal (1-bit data) while the output of the 4-bit up-down counter 3 is equal to or greater than the lower limit value.

The set signal (1-bit data) of the 4-bit counter section 1 is supplied to one of signal input terminals of the 2-input AND gate 4a. The remaining signal input terminal of the AND gate 4a is connected to an output terminal of the 2-input AND gate 4d. A signal output terminal of the comparator 4b is connected one of signal input terminals of the 2-input AND gate 4d, and also connected to an enable terminal E of a counter 4f. Additionally, a signal output terminal of the comparator 4c is connected to the remaining signal input terminal of the AND gate 4d, and also connected to an enable terminal E of a counter 4i.

In the above-mentioned structure, the AND gate 4d outputs a high-level signal when the count value output by the 4-bit up-down counter 3 is between the upper limit value and the lower limit value. On the other hand, the AND gate 4d outputs a low-level signal when the count value of the 4-bit up-down counter 3 is greater than the upper limit value or smaller than the lower limit value. When the AND gate 4d is outputting the high-level signal, the AND gate 4a outputs a high-level signal to the enable terminal E of the register 4e in response to an input of the set signal of the 4-bit counter section 1. When receiving the above-mentioned high-level signal at the enable terminal E, the register 4e holds the count value supplied from the signal input terminal, and outputs the held data to a comparator 5.

When the AND gate 4d is outputting the low-level signal, i.e., when the count value which the 4-bit up-down counter 3 outputs becomes greater than the upper limit value or smaller than the lower limit value, the AND gate 4a continuously outputs a low-level signal irrespective of the set signal from the 4-bit counter section 1. According to the above-mentioned structure, the data held in the register 4e is not updated after the count value becomes greater than the upper limit value or becomes smaller than the lower-limit value.

The counter 4f starts a counting operation when the count value which the counter 3 outputs exceeds the upper limit value, that is, when the high-level signal is supplied to the enable terminal E from the comparator 4b, and outputs the count value to one of signal input terminals of a 2-input AND gate 4g. The first schedule value is supplied to the remaining signal input terminal of the AND gate 4g. The AND gate 4g outputs a high-level signal to a set terminal of a flip-flop 4h of the subsequent stage when the count value of the counter 4f becomes equal to the first schedule value. Accordingly, an output inversion signal of the flip-flop 4h is supplied to the up-down control signal input terminal of the 4-bit up-down counter 3. Thus, the counter 3, which has been functioned as an up-counter, is changed to function as a down-counter.

Similarly, the counter 4i starts a counting operation when the count value which the counter 3 outputs becomes smaller than the lower limit value, that is, when the high-level signal is supplied to the enable terminal E from the comparator 4c, and outputs the count value to one of signal input terminals of a 2-input AND gate 4j. The second schedule value is supplied to the remaining signal input terminal of the AND gate 4j. The AND gate 4j outputs a high-level signal to a reset terminal of the flip-flop 4h of the subsequent stage when the count value of the counter 4i becomes equal to the second schedule value. According to the above-mentioned structure, a high-level output inversion signal is output from the flip-flop 4h to the up-down control signal input terminal of the 4-bit up-down counter 3. Thus, the counter 3, which has been functioned as a down-counter, is changed to function as an up-counter.

Figure 7:
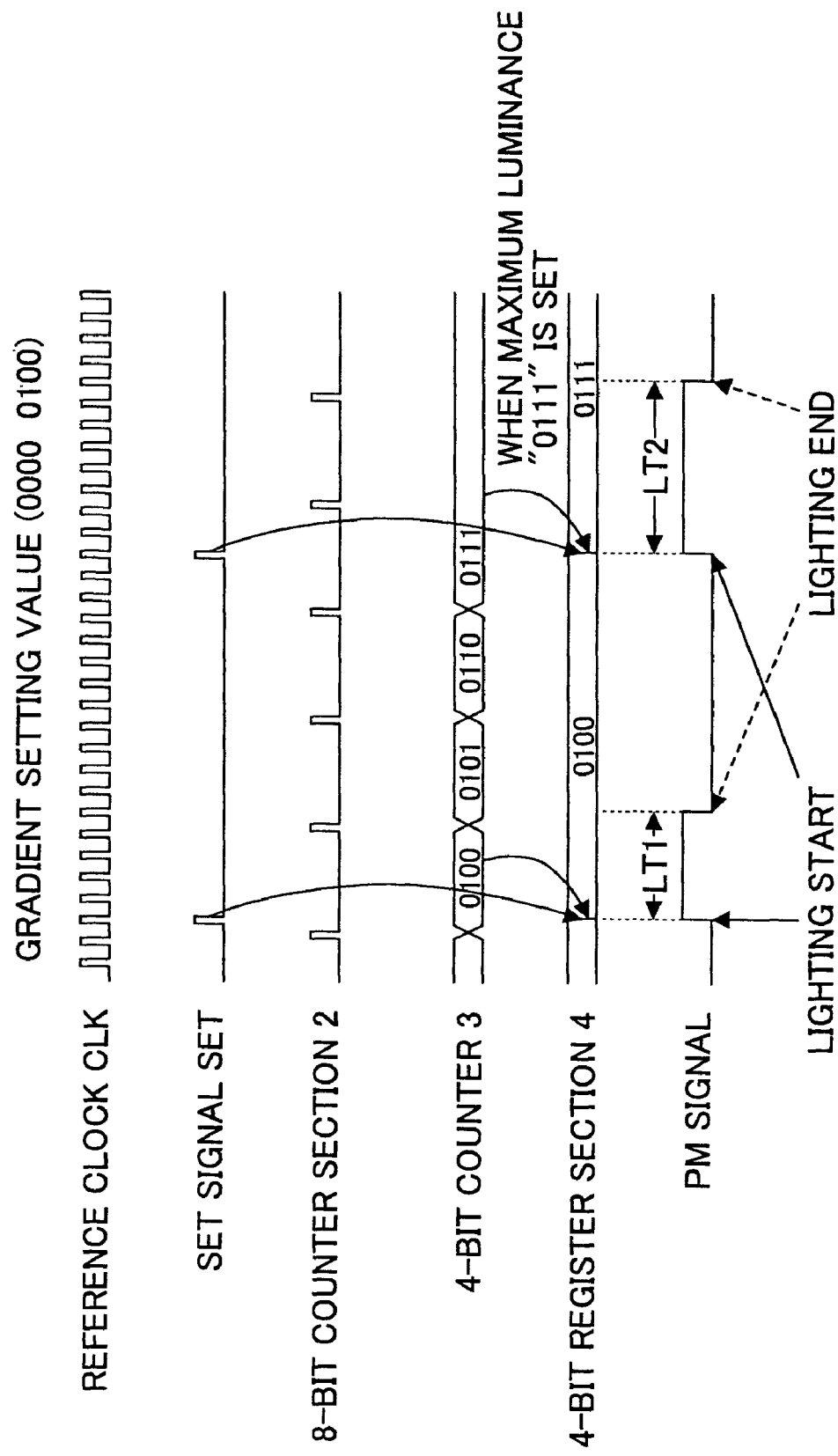
FIG. 7 is a time chart showing a status of each signal in the PWM signal generating circuit sown in FIG. 2 in a case in which a gradient setting value is set to "00000100"
Figure 8:
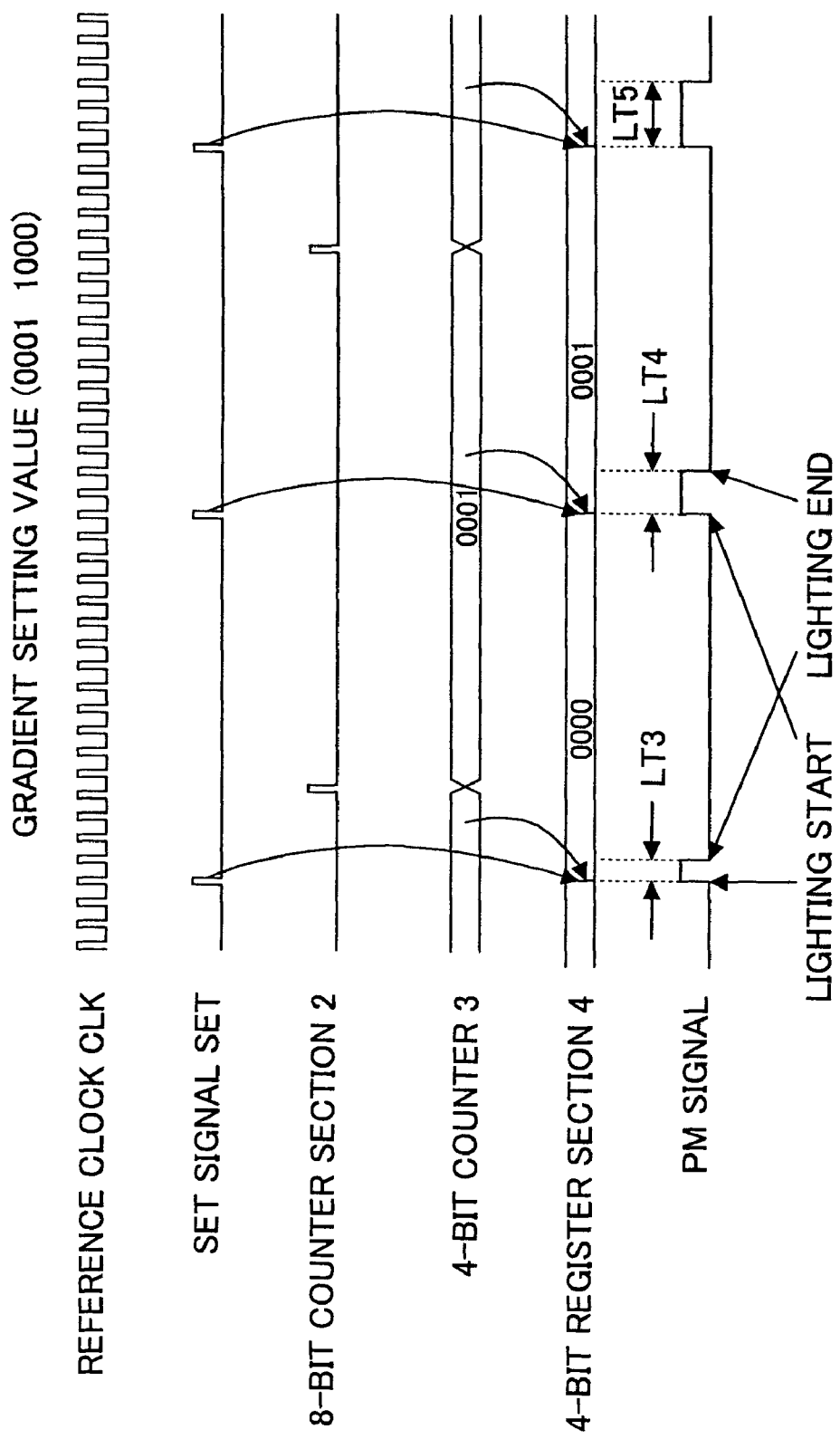
FIG. 8 is a time chart showing a status of each signal in the PWM signal generating circuit shown in FIG. 2 in a case in which the gradient setting value is set to "00011000"

FIG. 7 is a time chart showing a status of each signal in the PWM signal generating circuit 100 in a case in which the gradient setting value is set to "00000100", that is, in a case in which an increasing rate of a luminescence duty ratio of the light-emitting diode specified by the gradient setting value is set a relatively fast tempo. FIG. 8 is a time chart showing a status of each signal in the PWM signal generating circuit 100 in a case in which the gradient setting value is set to "00011000", that is, in a case in which an increasing rate of the luminescence duty ratio of the light-emitting diode specified by the gradient setting value is set to a relatively slow tempo.

As apparent from comparison between FIG. 7 and FIG. 8, by changing the gradient setting value, a rate of increase and decrease of a period, during which the PWM signal is at a high level within a cycle in which the set signal is output.

Moreover, as shown in FIG. 7 and FIG. 8, the flip-flop 6 changes a signal level of the PWM signal to a high level in response to an input of the high-level pulsed set signal output from the 4-bit counter section 1. As shown in FIG. 2, in response to the input of the high-level PWM signal, the N-channel type MOSFET 101 turns on, as shown in FIG. 2, and, thereby, the light-emitting diode 102 emits a light. Moreover, the 4-bit register section 4 holds the count value output from the 4-bit up-down counter 3.

FIG. 7 shows that "0100" is held according to the first input of the set signal. Additionally, FIG. 7 shows that "0111" is held according to a next input of the set signal.

Moreover, FIG. 8 shows that "0000" is held according to the first input of the set signal. Additionally, FIG. 8 shows that "0001" is held according to a next input of the set signal. The 4-bit register section 4 returns the PWM signal to a low level after the count value output by the 4-bit counter section 1 becomes equal to the held count value.

Figure 9:
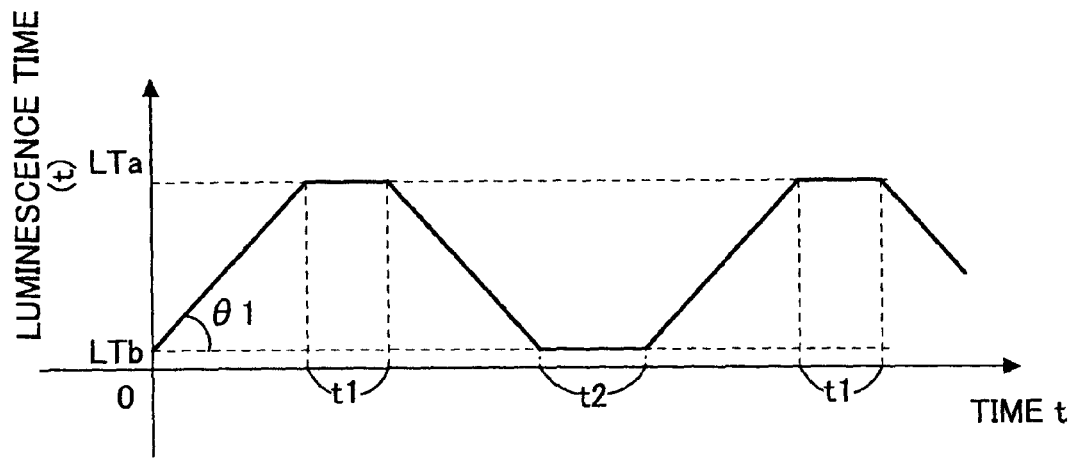
FIG. 9 is a graph showing changes in a luminescence time per 1 cycle of a 4-bit counter specified by a PWM signal output by the PWM signal generating circuit shown in FIG. 2 which operates in the state shown in FIG. 7.

FIG. 9 is a graph showing changes in the luminescence time LT per 1 cycle of the 4-bit counter 1 specified by the PWM signal output by the PWM signal generating circuit 100 which operates in the state shown in FIG. 7. In this example, the upper limit value is represented by LTa and the lower limit value is represented by LTb. Additionally, the first schedule value is set to a count value corresponding to a time period t1, and the second schedule value is set to a count value corresponding to a time period t2.

Figure 10:
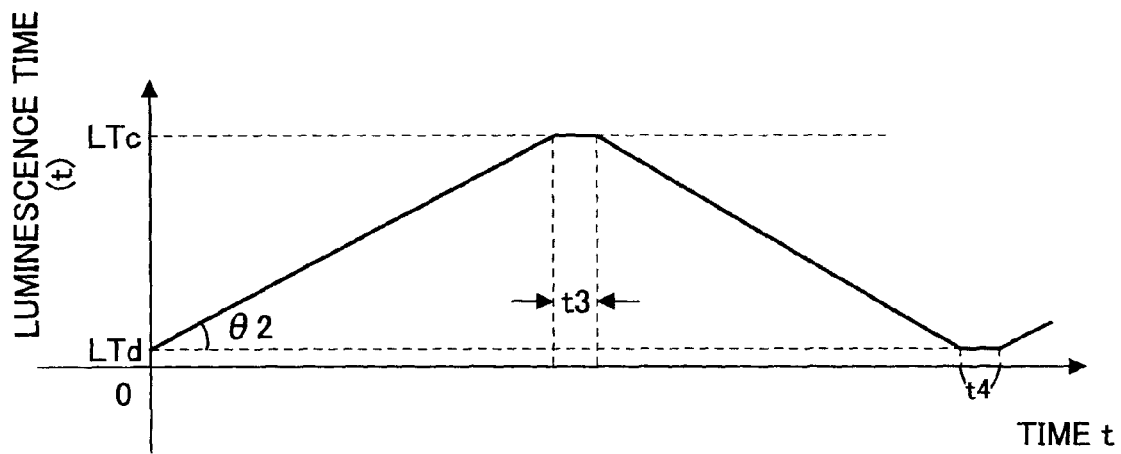
FIG. 10 is a graph showing changes in the luminescence time LT per 1 cycle of the 4-bit counter specified by the PWM signal output by the PWM generating circuit shown in FIG. 2 which operates in the state shown in FIG. 8.

FIG. 10 is a graph showing changes in the luminescence time LT per 1 cycle of the 4-bit counter 1 specified by the PWM signal output by the PWM generating circuit 100 which operates in the state shown in FIG. 8. In this example, the upper limit value is represented by LTc and the lower limit value is represented by LTd. Additionally, the first schedule value is set to a count value corresponding to a time period t3, and the second schedule value is set to a count value corresponding to a time period t4.

It can be interpreted from comparison between FIG. 9 and FIG. 10, by increasing the gradient setting value, an inclination θ2 can be made smaller than an inclination θ1 that represents an amount of change in the luminescence time LT per unit time.

As mentioned above, by using the PWM generating circuit 100 having the above-mentioned structure and after setting the gradient setting value, the upper limit value, the lower limit value, the first schedule value and the second schedule value, the luminescence time of the light-emitting diode 102 can be increased and decreased smoothly with a desired tempo and a desired width of change (corresponding to difference between the upper limit value and the lower limit value) during a predetermined time period (per 1 cycle of the 4-bit counter) only by supplying the reference clock signal CLK without any load to the CPU 150.

Moreover, by constituting the PWM generating circuit 100 only by circuit elements outputting digital signals, a more stable operation can be achieved than a case in which a luminescence time is adjusted using circuit elements outputting analog signals such as a DAC. Moreover, since an electric power is consumed by operation only at a reception time, a power consumption is much less than that in a case where a DAC is used which consumes an electric power at a time other than a reception time, unless a power is turned off due to an energy saving function, etc., thereby suitable for an application such as a portable telephone which is driven by a battery.

Furthermore, a further complicated turning on and off of the light-emitting diode can be easily achieved by merely changing the gradient setting value, the upper limit value, the lower limit value, the first schedule value and the second schedule value by a control of the CPU 150.

The present invention is not limited to the specifically disclosed embodiments, and variations and modifications may be made without departing from the scope of the present invention.

The present application is based on Japanese priority application No. 2002-338129 filed Nov. 21, 2002, the entire contents of which are hereby incorporated by reference.

What is claimed is:

1. A portable electronic device including circuitry for generating a pulse width modulation (PWM) signal, said circuitry comprising:
   a first counter circuit periodically changing a PWM signal output therefrom into an active state; and
   a second counter circuit changing the PWM signal, changed into the active state by said first counter circuit, into an inactive state within each cycle,
   wherein said second counter circuit increases or decreases, at a predetermined rate in a predetermined period, a time period between (i) a time when the PWM signal is changed into the active state and (ii) a time when the PWM signal is changed into the inactive state.

2. The portable electronic device as claimed in claim 1, further comprising a light-emitting element configured to receive said PWM signal and emit light under control of said PWM signal.

3. The portable electronic device as claimed in claim 2, wherein said light-emitting element includes a light-emitting diode.

4. The portable electronic device as claimed in claim 3, wherein said circuitry controls generation of said PWM signal to control a luminescence duty cycle of said light-emitting diode.

5. A portable electronic device including circuitry for generating a pulse width modulation (PWM) signal, said circuitry comprising:
   a first counter circuit periodically changing a PWM signal output therefrom into an active state;
   a second counter circuit changing the PWM signal, changed into the active state by said first counter circuit, into an inactive state within each cycle; and
   a specifying circuit that specifies a first schedule time and a second schedule time,
   wherein said second counter circuit starts to decrease an active-to-inactive time period after the active-to-inactive time period reaches an upper limit value and the first schedule time has elapsed, and said second counter circuit increases the active-to-inactive time period after the active-to-inactive time period reaches a lower limit value and the second schedule time has elapsed.

6. The portable electronic device as claimed in claim 5, further comprising a light-emitting element configured to receive said PWM signal and emit light under control of said PWM signal.

7. The portable electronic device as claimed in claim 6, wherein said light-emitting element includes a light-emitting diode.

8. The portable electronic device as claimed in claim 7, wherein said circuitry controls generation of said PWM signal to control a luminescence duty cycle of said light-emitting diode.

9. The portable electronic device as claimed in claim 1, further comprising a first specifying circuit that specifies an upper limit value and a lower limit value, wherein said second counter circuit changes periodically the time period between the time when the PWM signal is changed into the active state and the time when the PWM signal is changed into the inactive state, within a range between the upper limit value and the lower limit value.

10. The portable electronic device as claimed in claim 9, further comprising a second specifying circuit that specifies a first schedule time and a second schedule time, wherein said second counter circuit starts to decrease the time period between the time when the PWM signal is changed into the active state and the time when the PWM signal is changed into the inactive state, after said time period reaches the upper limit value and the first schedule time has elapsed, and said second counter circuit increases said time period after the time period reaches the lower limit value and the second schedule time has elapsed.

* * * * *